(12) United States Patent
Kimura et al.

(10) Patent No.: US 11,373,899 B2
(45) Date of Patent: Jun. 28, 2022

(54) PATTERN GENERATION DEVICE, PATTERN GENERATION METHOD, AND METHOD OF MANUFACTURING SEMICONDUCTOR DEVICE

(71) Applicant: Kioxia Corporation, Minato-ku (JP)

(72) Inventors: Taiki Kimura, Kawasaki (JP); Tetsuaki Matsunawa, Fujisawa (JP)

(73) Assignee: Kioxia Corporation, Minato-ku (JP)

( * ) Notice: Subject to any disclaimer, the term of this patent is extended or adjusted under 35 U.S.C. 154(b) by 97 days.

(21) Appl. No.: 16/808,467

(22) Filed: Mar. 4, 2020

(65) Prior Publication Data

US 2020/0388528 A1 Dec. 10, 2020

(30) Foreign Application Priority Data

Jun. 4, 2019 (JP) .............................. JP2019-104838

(51) Int. Cl.
| | |
|---|---|
| *H01L 21/78* | (2006.01) |
| *H01L 21/768* | (2006.01) |
| *G03F 7/20* | (2006.01) |
| *H01L 29/78* | (2006.01) |
| *G06F 30/392* | (2020.01) |
| *H01L 27/02* | (2006.01) |

(52) U.S. Cl.
CPC .... *H01L 21/76802* (2013.01); *G03F 7/70616* (2013.01); *G06F 30/392* (2020.01); *H01L 21/76898* (2013.01); *H01L 27/0207* (2013.01); *H01L 29/7845* (2013.01)

(58) Field of Classification Search
CPC ........... H01L 21/76802; H01L 27/0207; H01L 29/7845; H01L 21/76898; G03F 1/70; G03F 7/70616; G06F 30/392; G06F 30/398
See application file for complete search history.

(56) References Cited

U.S. PATENT DOCUMENTS

| | | | |
|---|---|---|---|
| 6,548,312 B1 * | 4/2003 | Hayano | G03F 7/70433 430/394 |
| 8,362,622 B2 | 1/2013 | Sproch et al. | |
| 9,886,542 B2 * | 2/2018 | Han | G06F 30/398 |
| 2018/0034241 A1 | 11/2018 | Hooge et al. | |

FOREIGN PATENT DOCUMENTS

| | | | | |
|---|---|---|---|---|
| JP | H09326349 A | * | 12/1997 | |
| JP | 2006058452 A | * | 3/2006 | G03F 1/144 |

OTHER PUBLICATIONS

Stobert et al., "Model-Based correction for local stress-induced overlay errors", Globalfounderies Inc., Proceedings of SPIE, vol. 10587, 2018, 12 pages.

* cited by examiner

*Primary Examiner* — Hrayr A Sayadian

(74) *Attorney, Agent, or Firm* — Oblon, McClelland, Maier & Neustadt, L.L.P.

(57) ABSTRACT

According to the present embodiment, the pattern generation device includes a misalignment value calculation unit configured to acquire a layout information, calculate a layout function from the layout information, and calculate a misalignment value by a convolution of the layout function and an integral kernel having a predetermined parameter, and a pattern correction unit configured to correct a pattern to generate a modified layout information using a calculated result by the misalignment value calculation unit, and output the modified layout information.

5 Claims, 11 Drawing Sheets

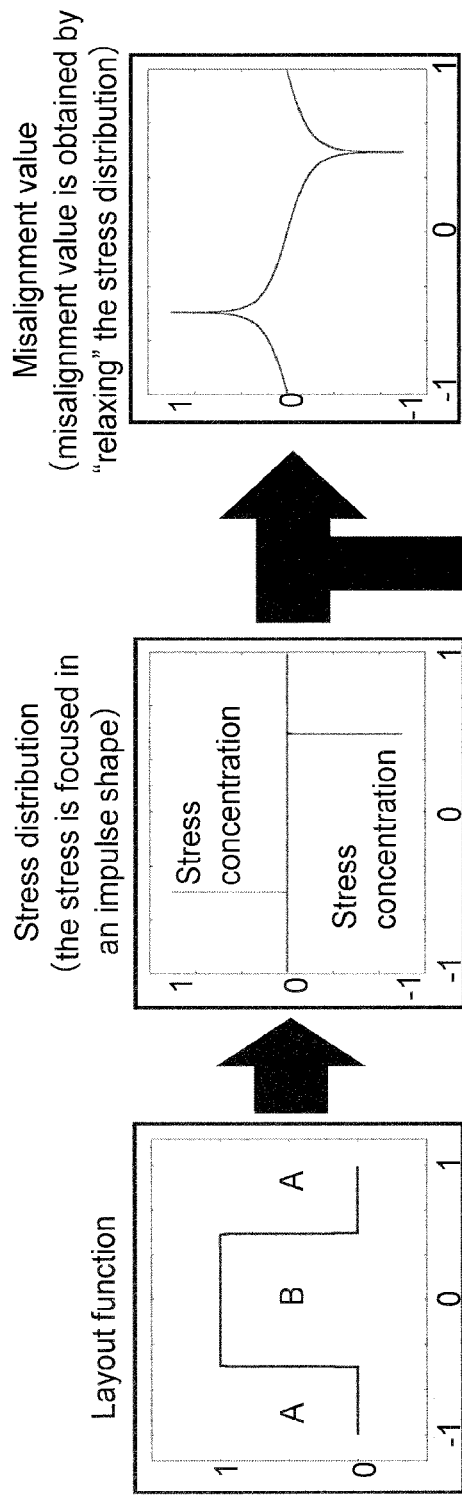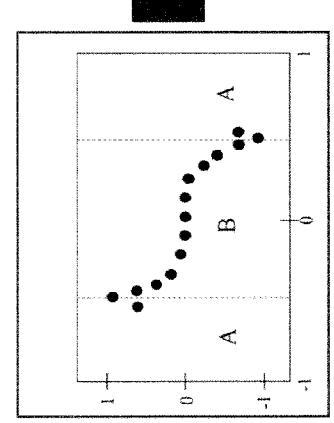

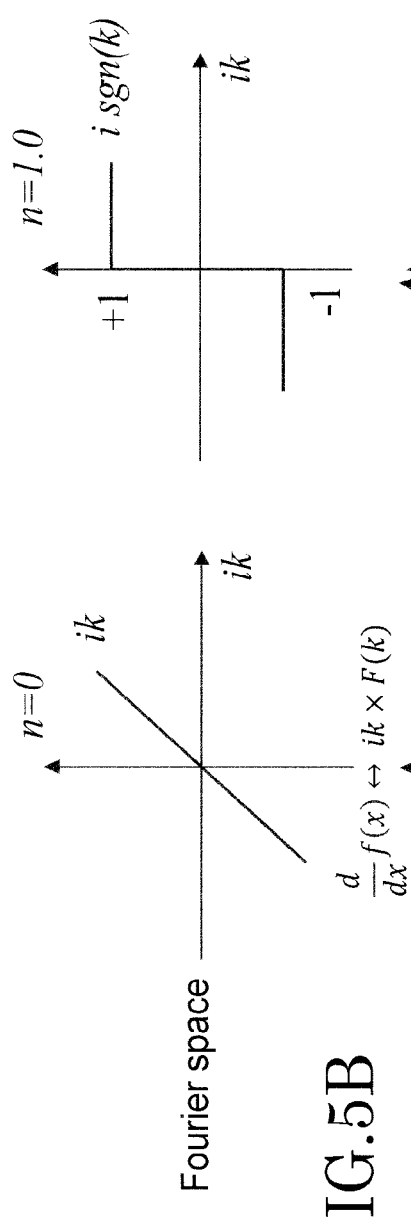
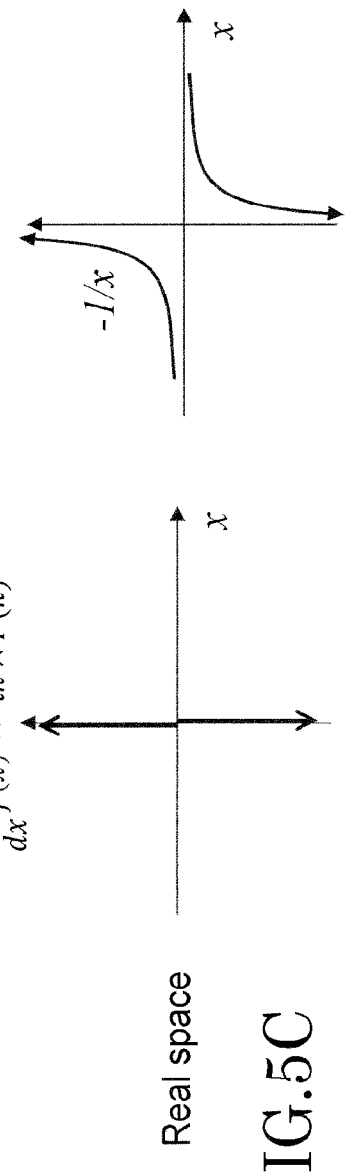
FIG.5A
FIG.5B
FIG.5C
FIG.5D
FIG.5E

FIG.6G  n=1.0  sgn(k)
FIG.6E  n=0.8
FIG.6C  n=0.5
FIG.6A  n=0  k
Fourier space

FIG.6H  -1/x

Real space

Differential-like effect

Exact differential

FIG.8A Mask Function: $m(x) \leftrightarrow M(k)$

FIG.8B Fourier space $M(k) \times \underbrace{\exp\left(-\frac{\sigma^2 k^2}{2}\right)}_{\text{Gauss}} \times \underbrace{\frac{ik}{|k|^n}}_{\text{First integral kernel}} = M(k) \times \text{kernel}(k)$

FIG.8C Fourier space $M(k) \times \underbrace{\sum_{j=1}^{N} \exp\left(-\frac{\sigma_j^2 k^2}{2}\right) \frac{ik}{|k|^{n_j}}}_{\text{Second integral kernel}} = M(k) \times \text{kernel}(k)$ N : Total number of terms (N=1 corresponds to formula B)

PATTERN GENERATION DEVICE, PATTERN GENERATION METHOD, AND METHOD OF MANUFACTURING SEMICONDUCTOR DEVICE

CROSS-REFERENCE TO RELATED APPLICATION(S)

This application is based upon and claims the benefit of priority from the prior Japanese Patent Application No. 2019-104838, filed on Jun. 4, 2019, the entire contents of which are incorporated herein by reference.

FIELD

The present disclosure embodiments relate to a pattern generation device, a pattern generation method and a method of manufacturing semiconductor device.

BACKGROUND

The manufacturing process of a semiconductor device includes a process of stacking layers made of a plurality of different materials. Various hole patterns are formed by an exposure process in these layers. These patterns should be aligned with the underlying patterns. However, when a plurality of layers made of different materials is stacked, a membrane stress is generated, resulting in a misalignment of patterns. In addition, the misalignment of patterns is also caused by stress generated in the joint surface of different materials. Therefore, for such misalignment of a pattern, (1) a method of correcting the mask pattern by obtaining the position displacement amount with reference to the measured value, and (2) a method of correcting the mask pattern by calculating the stress by simulations and predicting the misalignment value, have been proposed.

BRIEF DESCRIPTION OF THE DRAWINGS

FIGS. 4A, 4B, 4C and 4D are diagrams illustrating a process of calculating a misalignment value caused by stress from layout information in the pattern generation method according to an embodiment of the present disclosure;

FIGS. 5A, 56, 5C, 5D and 5E are diagrams illustrating a definition of an integral kernel and the graphs of its functions in Fourier space and real space used in an embodiment of the present disclosure;

FIGS. 6A, 6B, 6C, 6D, 6E, 6F, 6G and 6H are diagrams illustrating the graphs of the integral kernel in Fourier space and real space used in an embodiment of the present disclosure;

FIGS. 8A, 8B and 8C are diagrams illustrating an example of the mask function and the integral kernel in Fourier space used in an embodiment of the present disclosure;

DETAILED DESCRIPTION

A pattern generation device according to an embodiment of the present disclosure includes a misalignment value calculation unit and a pattern correction unit. The misalignment value calculation unit acquires a layout information, calculates a layout function from the layout information, and calculates a misalignment value by a convolution of the layout function and an integral kernel having a predetermined parameter. The pattern correction unit corrects a pattern to generate a modified layout information using a calculated result by the misalignment value calculation unit, and output the modified layout information.

The pattern generation device, pattern generation method and method of manufacturing semiconductor device according to an embodiment of the present disclosure will be described in detail below with reference to the drawings.

[Configuration of a Pattern Generation Device/a Pattern Generation Method]

Figure 1:
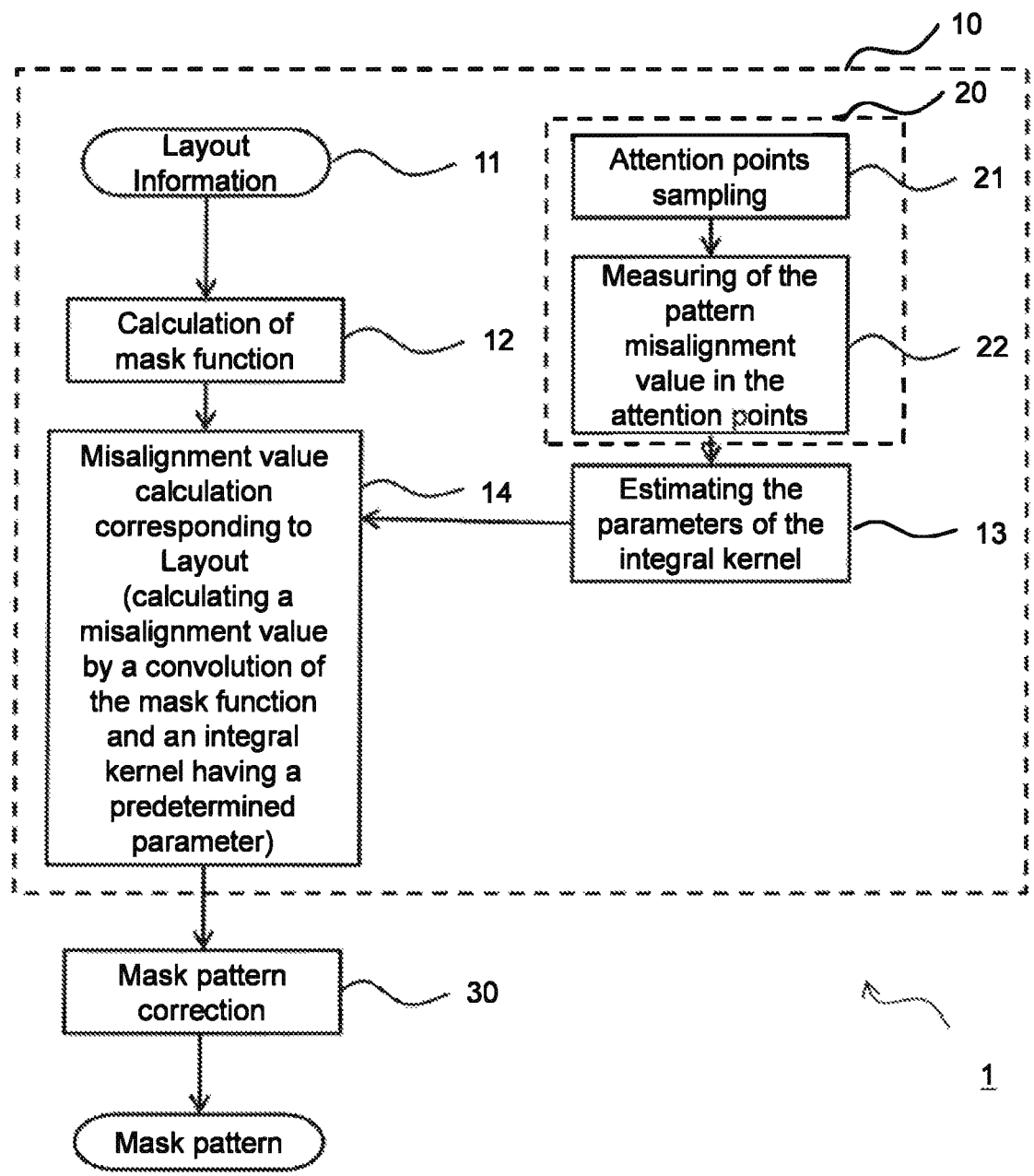
FIG. 1 is a configuration diagram illustrating a pattern generation device according to an embodiment of the present disclosure.
Figure 2:
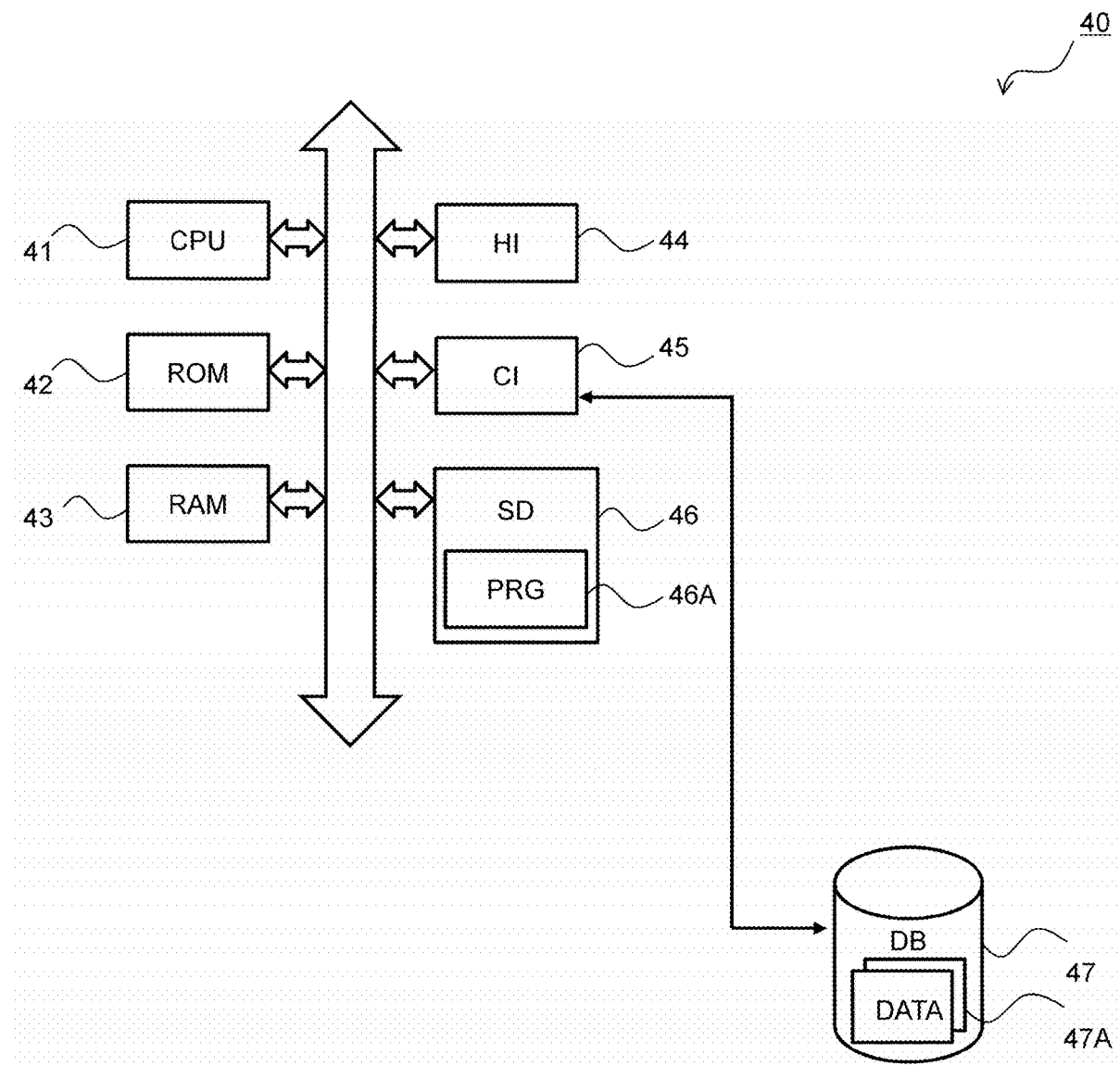
FIG. 2 is a configuration diagram illustrating a system incorporating the pattern generation device according to an embodiment of the present disclosure.

FIG. 1 shows a pattern generation device 1 according to an embodiment of the present disclosure. The pattern generation device 1 comprises a misalignment value calculation unit 10 and a mask pattern correction unit 30. Both are implemented as a computer program in a computer system as shown in FIG. 2.

The misalignment value calculation unit 10 acquires a layout information 11 defining a plurality of areas in which characteristic misalignment occurs by stress and calculates a layout function from the layout information 11 (step 12). Since the pattern is two-dimensional, the layout function is a function with two arguments, x and y, indicating the position on the plane. In the following examples of a semiconductor device, the layout function can be 1 in the region B of the semiconductor device and 0 in the region A of the semiconductor device. However, the layout function is not limited to this and may set any values that differ from region to region.

The integral kernel has predetermined parameters, which are estimated based on a pattern misalignment value based on a measured value. The generation of a misalignment value of the pattern based on the measured value (step 20) is as follows: The first step is to sample the attention points on the layout (step 21). The attention points may be sampled equidistant, or may be sampled densely at the boundaries of the regions in the layout. Then, the pattern misalignment value in the individual attention points are measured by actually measuring the exposure pattern formed by the exposure process using the mask pattern prior to the correction by using an scanning electron microscope (SEM) or the like (STEP22). The parameters of the integral kernel are estimated by fitting to the measured data (step 13).

Next, the misalignment value calculation unit 10 calculates a misalignment value corresponding to the layouts (step 14). The misalignment value is calculated by convolution of the layout function and the integral kernel, which will be described later. The misalignment value is output in a map format binary data or an ASCII.

The mask pattern correction unit 30 performs correction of the patterns using the calculation results obtained in the misalignment value calculation unit 10. For example, the mask pattern correction unit 30 receives the original data in the GDS format, performs correction using misalignment value, and outputs the corrected data in the GDS format as a mask pattern.

The pattern generation device 1 (pattern generation method) according to an embodiment of the present disclosure is implemented as a computer program in a computer system 40 as shown in FIG. 2. The computer system 40 includes a system terminal having a CPU41, ROM42, RAM43, human interface (HI) 44, communication interface (CI) 45, and storage device (SD) 46 connected by a bus, and a database (DB) 47 connected to the system terminal through the communication interface (CI) 45 by a network.

The layout information 11, the pattern misalignment value measured at each individual attention points, and original data of the mask pattern are stored in a predetermined area 47A of the database (DB) 47.

The steps of calculating the layout function (step 12), estimating the parameters of the integral kernel by fitting to the measured data (step 13), and calculating the misalignment value corresponding to the layout (step 14) are all implemented as a program module, which is stored in a predetermined area 46A of the storage device (SD) 46. The mask pattern correction unit 30 for performing the mask pattern correction is also implemented as a program module, which is stored in a predetermined area 46A of the storage device (SD) 46.

[Effects Based on the Configuration of the Pattern Generation Device/Pattern Generation Method]

The pattern generation device/pattern generation method according to an embodiment of the present disclosure is configured as described above. In order to correct the misalignment caused by stress, the misalignment value is expressed as a convolutional integral of the layout function and integral kernel, which is less calculation and makes it feasible to correct the entire surface of semiconductor chips, which was impossible with a rigorous stress simulation with a large amount of calculation.

[Need to Mask Patterns Correction in Semiconductor Device]

Hereinafter, referring to FIG. 3A and FIG. 3B, the need to correct the position of the mask pattern used in the exposure process in the manufacturing process of the semiconductor device according to an embodiment of the present disclosure will be described.

Figure 3A:
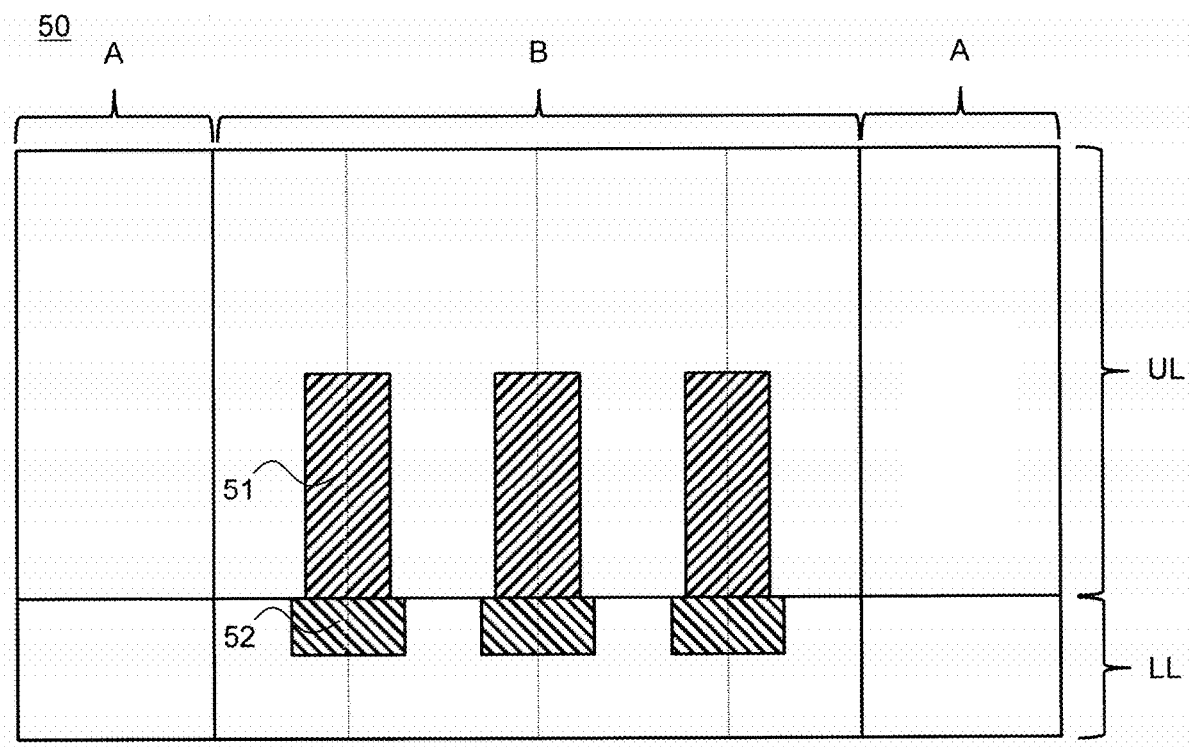
FIG. 3A and FIG. 3B are diagrams illustrating a misalignment between a upper layer and a lower layer in a semiconductor device according to an embodiment of the present disclosure.
Figure 3B:
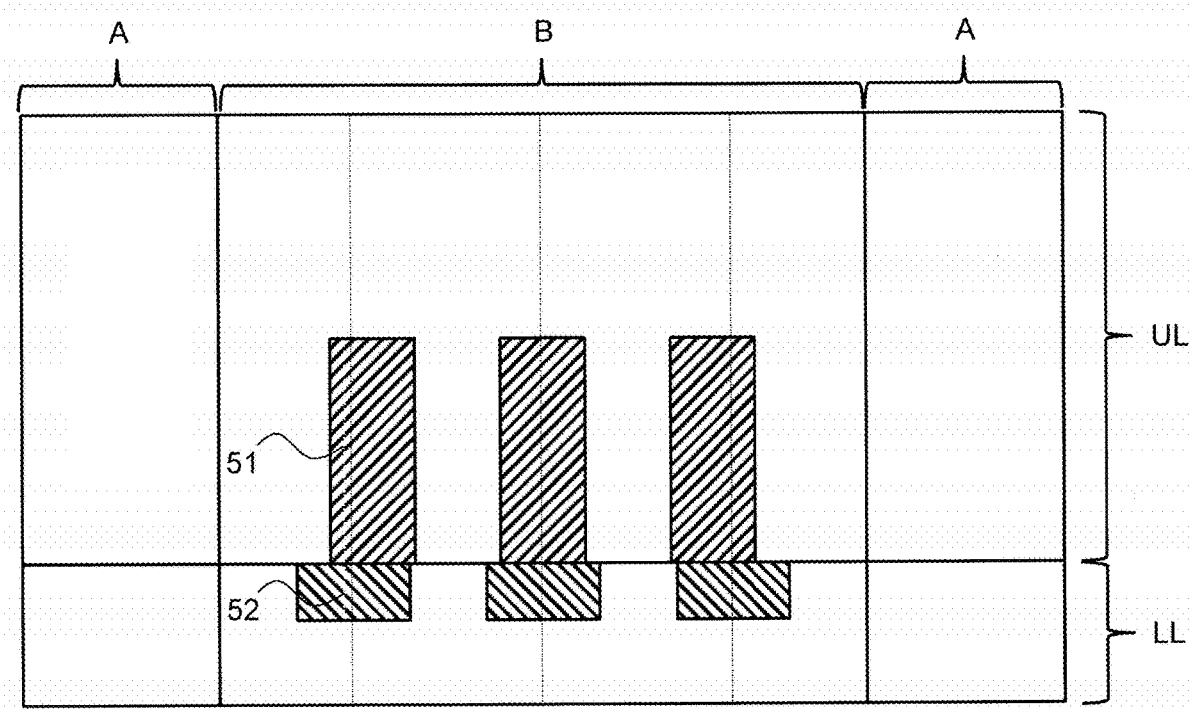

FIG. 3A and FIG. 3B are diagrams illustrating a cross section of a semiconductor device according to an embodiment of the present disclosure. In an embodiment of the present disclosure, the semiconductor device 50 is a semiconductor chip. In an embodiment of the present disclosure, the construction of the semiconductor device 50 is referred to as a layout information. In FIG. 3A and FIG. 3B, a region A and a region B in the semiconductor device 50 are shown.

FIG. 3A shows a cross-section of the region A and the region B including Upper Layer (UL) and Lower Layer (LL). In the present disclosure, the region A and the region B are the unit regions that can be approximated as homogeneous different materials in the stress calculations of upper layer (UL).

Due to the effects of stress, the upper layer (UL) may stretch or compress, and there may be a misalignment between the lower layer (LL) and the upper layer (UL). FIG. 3B is a diagram showing an example in which a misalignment occurs between the electrode 51 (e.g., memory hole, via hole) of the upper layer (UL) and the electrode 52 (e.g., wiring, diffusion layer) of the lower layer (LL) in the semiconductor device. When such a misalignment occurs, the electric resistance between the electrode 52 formed in the lower layer (LL) and the electrode 51 formed in the upper layer (UL) increases. Further, if the position is excessively shifted, it is possible to lead a disconnection of the upper-layer electrode 51 and the lower-layer electrode 52. This is a reason for reducing the yield of the semiconductor device, so that the correction of the mask pattern is needed.

[Procedures for Calculation of Misalignment Value Corresponding to the Layouts]

FIGS. 4A, 4B, 4C and 4D are diagrams illustrating a process of calculating a misalignment value caused by stress from the layout information as shown in FIG. 3A and FIG. 3B in a pattern generation method according to an embodiment of the present disclosure. The process is to express the phenomena that the misalignment value is relaxed in proportion to the distance from the position where the stress is concentrated by the formula, the position where the stress is concentrated is obtained from the layout information, and the relaxation value is obtained from the measured value.

FIG. 4A shows an layout function. From the layout information, it is possible to calculate (extract) the information of the plurality of regions in which characteristic misalignment are caused by stress, as a layout function. For example, from the layout information of FIG. 3A and FIG. 3B, it is possible to calculate (extract) a layout function that takes a value of 0 in the region A and a value of 1 in the region B. By differentiating this layout function, as shown in FIG. 4B, the position where the stress is concentrated (before relaxation) is specified. That is, by differentiating the layout function, as shown in FIG. 4B, a stress distribution in which the stress is focused in an impulse shape and distributed in the region boundary can be obtained.

FIG. 4C shows an example of the distribution of misalignment value measured from the pattern with structures corresponding to layout function. In the stress distribution as shown in FIG. 4B, the stress is focused in an impulse shape and distributed in the region boundary, whereas in the distribution of the misalignment value shown in FIG. 4C, the misalignment value becomes maximum at the region boundary and relaxed as it goes away from the region boundary. In other words, the distribution of misalignment value can be expressed as "relaxed" versions of stress distribution. Relaxation can be regarded as a moderate differential operation. Thus, stress concentration and relaxation can be expressed by a single integral kernel. That is, the misalignment value (after relaxation) caused by stress can be obtained by the convolution of the layout function and the integral kernel which provides an effect like a differential operation, as shown in FIG. 4D.

Integral kernel includes a "first integral kernel" defined by $ik/|k|^n$ (i is an imaginary number) on a Fourier space. Here, the parameter n (relaxation coefficient) is obtained by fitting it to the measured value. The misalignment value is calculated by the convolution of the layout function and the first integral kernel, which also represented by functions.

FIG. 5A is a diagram showing the definitions of the first integral kernel and FIGS. 5B, 5C, 5D and 5E are the graphs of its functions in Fourier space and real space used in an embodiment of the present disclosure. FIG. 5A shows definitions of the first integral kernel. The graphs of the functions are shown in FIG. 5B and FIG. 5C when the parameter n (relaxation coefficient) is 0. FIG. 5B is the graphs in Fourier space, FIG. 5C is the graphs in real space. As can be seen, the first integral kernel is simply a differential function at n=0 (ik in the Fourier space).

When the parameter n (relaxation coefficient) is 1.0, the first integral kernel is shown in FIG. 5D and FIG. 5E. FIG. 5D is the graph in the Fourier space, FIG. 5E is the graph in the real space. As can be seen, the first integral kernel is (−1/x) for providing a differential-like effect at n=1.0 (i·sgn (k) in the Fourier space, sgn is a signum function).

Figures 6B, 6D, 6F:
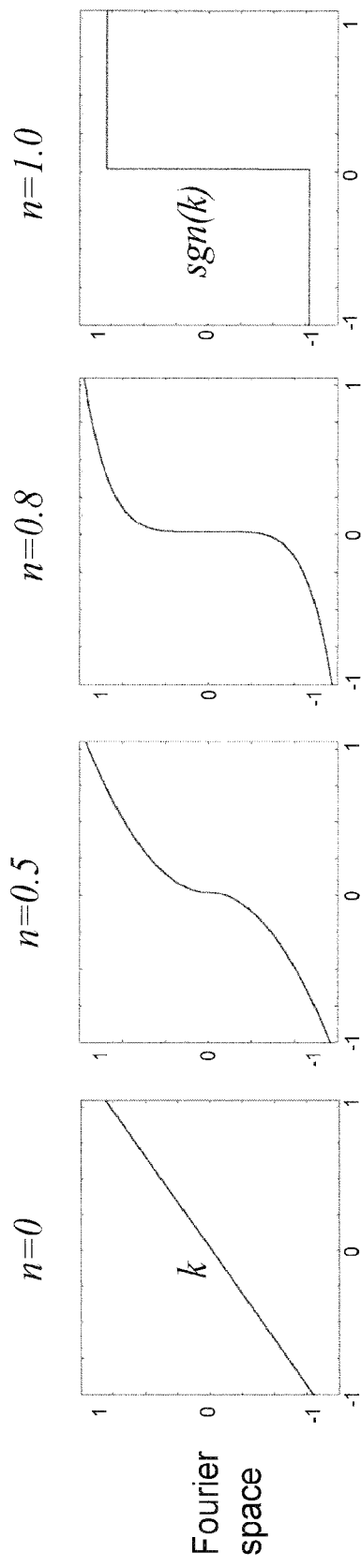

FIGS. 6A, 6B, 6C, 6D, 6E, 6F, 6G and 6H show the graphs of the first integral kernel when the parameter n (relaxation coefficient) is changed to 0, 0.5, 0.8, 1.0 in Fourier space and real space. FIG. 6A and FIG. 6B are the graphs when n=0, FIG. 6C and FIG. 6D are the graphs when n=0.5, FIG. 6E and FIG. 6F are the graphs when n=0.8, and FIG. 6G and FIG. 6H are the graphs when n=1.0. FIG. 6A, FIG. 6C, FIG. 6E, and FIG. 6G show the graphs of functions in Fourier space, and FIG. 6B, FIG. 6D, FIG. 6F, and FIG. 6H show the graphs of functions in real space.

Thus, the relaxation value can be easily adjusted by parameter n (relaxation coefficient) by defining the integral kernel in Fourier space with $ik/|k|^n$.

Figure 7A:
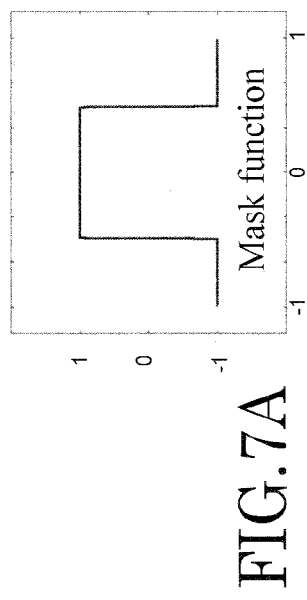
FIGS. 7A, 7B, 7C, 7D and 7E are diagrams illustrating a result of convolution of a mask function and the integral kernel used in an embodiment of the present disclosure.
Figure 7B:
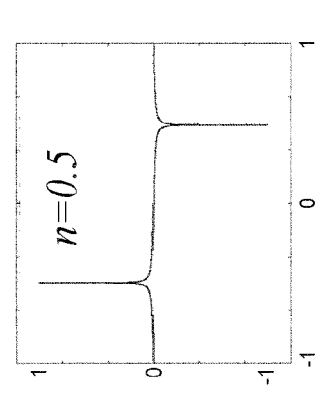
Figure 7D:
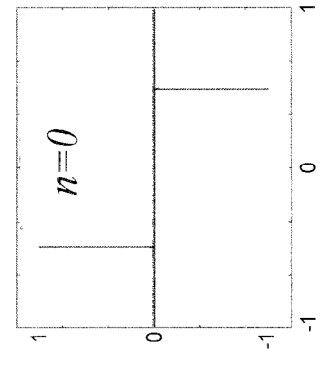
Figure 7C:
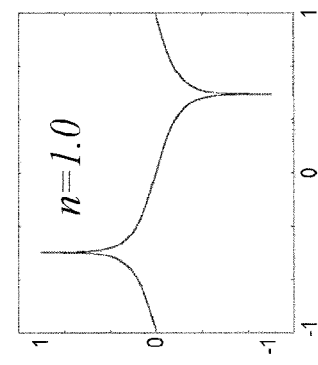
Figure 7E:
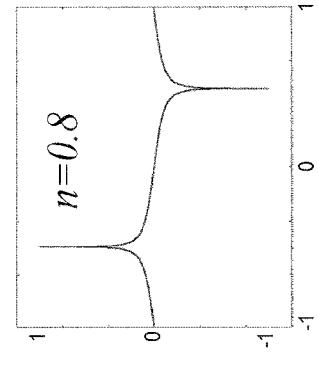

FIGS. 7B, 7C, 7D and 7E show the result of convolution of layout function (FIG. 7A Mask function) and the first integral kernel. Parameter n (relaxation coefficient) for n=0, 0.5, 0.8, and 1.0 are illustrated in FIG. 7B, FIG. 7C, FIG. 7D, and FIG. 7E, respectively. In this way, the misalignment value represented by functions can be calculated.

The pattern is represented on a two-dimensional plane. Thus, the layout function (Mask function) also has two-dimensional variables x and y. The misalignment value is also represented by a two-dimensional vector at this position. Thus, misalignment value is also a function with two-dimensional vector quantities. FIG. 4 to FIG. 7 are presented in one-dimensional form for ease of understanding.

[Integral Kernel Containing Gaussian Function]

The integral kernel described above further includes a Gaussian function defined as $\exp(-\sigma^2 k^2/2)$ in the Fourier space. The misalignment value can also be calculated by the convolution of a second integral kernel and the layout function (Mask Function). The second integral kernel includes the product of the Gaussian function and the first integral kernel. FIGS. 8A, 8B and 8C show the formula. FIG. 8A shows layout function (Mask Function). Real space denotes m(x) and Fourier space denotes M(k). As shown in FIG. 8B, the integral kernel (kernel(k)) convoluted with this layout function is expressed as the product of Gaussian function and the first integral kernel described above in the Fourier space. Further, as shown in FIG. 8C, the second integral kernel (kernel(k)) is expressed as a linear combination of the product of the Gaussian function and the first integral kernel. Note that the parameter a of the Gaussian function is also set as appropriate by fitting to the measured value.

Figure 9A:
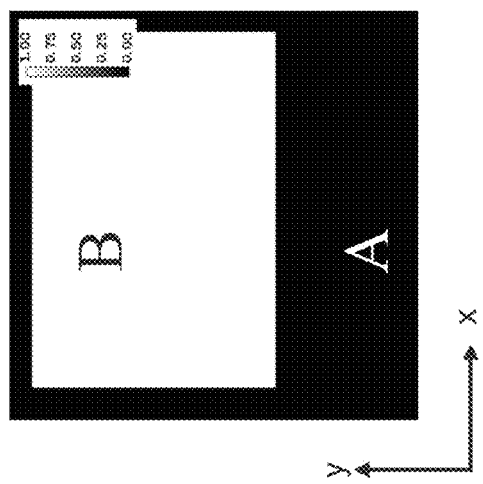
FIG. 9A and FIG. 9B are diagrams illustrating how patterns are generated by the pattern generation method used in an embodiment of the present disclosure.
Figure 9B:
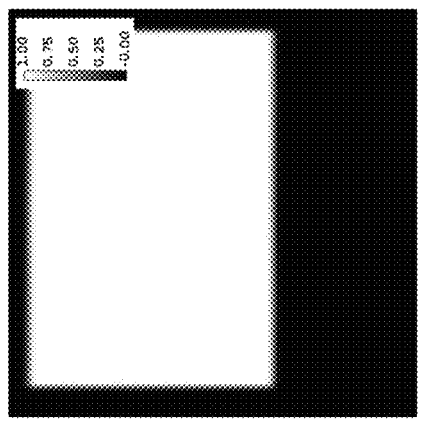

FIG. 9 and FIG. 10 show how the patterns are generated by the pattern generation method used in an embodiment of the present disclosure. FIG. 9A shows a layout function (Mask Function). Region B (denoted B in the figure) has a value of 1 and the other region A has a value of 0. FIG. 9B shows the result of the convolution of the layout function (Mask Function) in FIG. 9A and the Gaussian function defined by $\exp(-\sigma^2 k^2/2)$ in the real space. The transition region from 1 to 0 is indicated with a gradient effect.

Figure 10B:
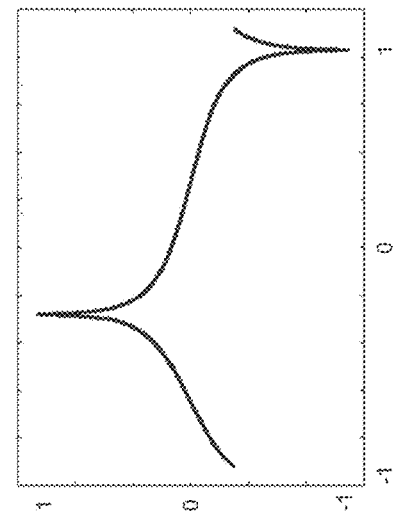
FIG. 10A and FIG. 10B are diagrams illustrating how patterns are generated by the pattern generation method used in an embodiment of the present disclosure.
Figure 10A:
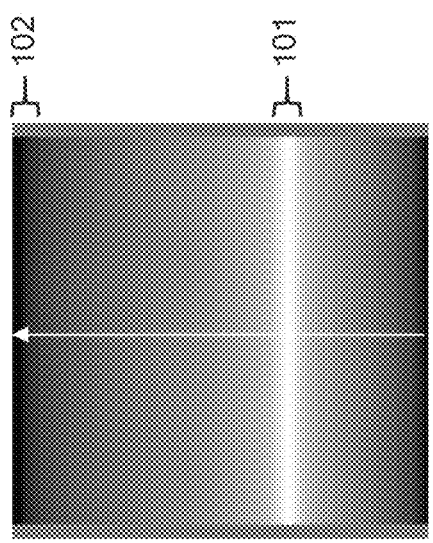

FIG. 10A shows the result of the convolution of the second integral kernel and the layout function (Mask Function) in FIG. 9A. The second integral kernel includes the linear combination of $ik/|k|^n$ which is an integral kernel and the Gaussian function defined by $\exp(-\sigma^2 k^2/2)$. This result is a stress misalignment map. The white line region 101 and the black line region 102 in the diagram are the concentric regions of the stress. These stress intensive regions correspond to the boundaries between region B and region A. In addition, these stress intensive regions correspond to the points where the material or density changes when the regions are approximated as having a single material or density, respectively. FIG. 10B is one-dimensional graphical representation of stress values on the lines indicated by arrows in FIG. 10A.

[Examples of Effects According to the Present Invention]

Using the semiconductor device shown in FIG. 3A and FIG. 3B as examples, the effect of an embodiment of the present disclosure was verified.

Figure 11:
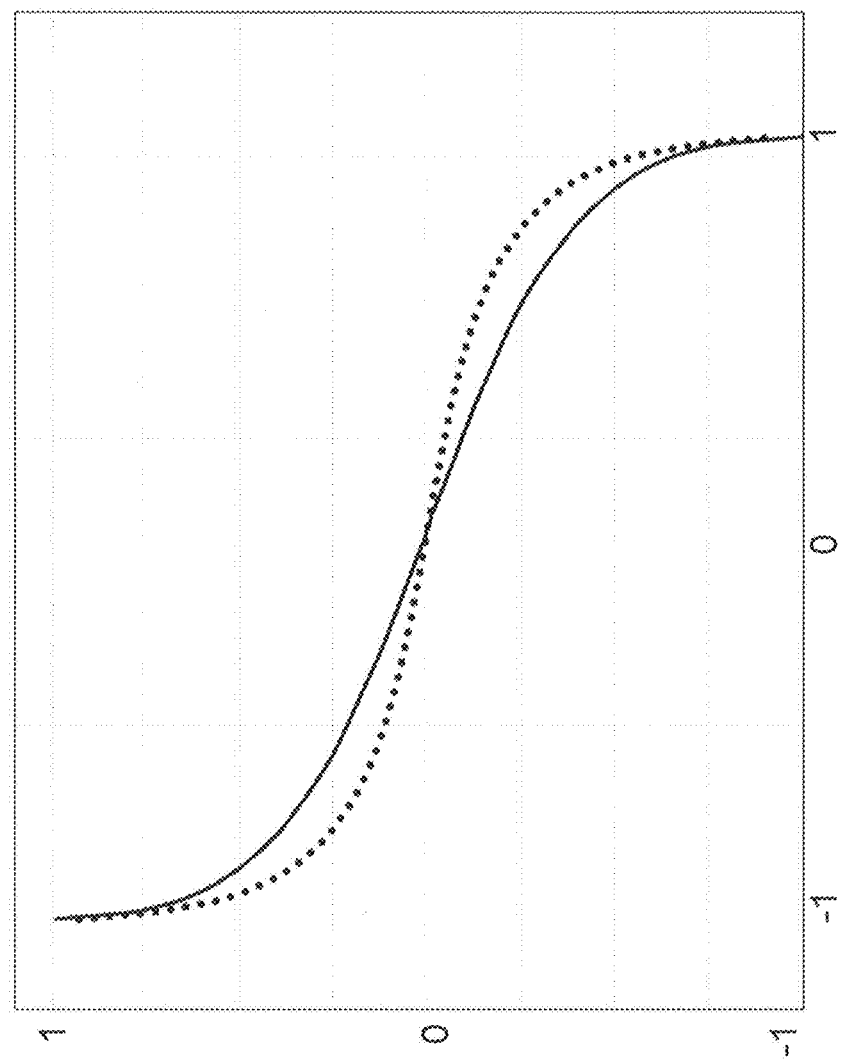
FIG. 11 is a diagram illustrating a comparison between a graph of misalignment value calculated by the pattern generation method used in an embodiment of the present disclosure and a misalignment value measured using a cross sectional SEM.

FIG. 11 is a graph in which the misalignment value calculated by the conventional method (dotted line) and the misalignment value calculated by the method of the embodiment (solid line) in the region B are displayed together. The conventional method is the rigorous stress calculation by the TCAD. The reason for the difference between the measured value and the calculated value in the conventional method is that the conventional method requires a large amount of calculation, so it is substantially impossible to carry out the so-called fitting operation sufficiently, in which the calculation conditions are changed multiple times so that the difference with the measured value becomes small. On the other hand, since the calculational amount of the method according to the embodiment of the present disclosure is significantly smaller than that of the conventional method, the difference with the measured value was improved compared with the conventional method because the fitting operation is easy.

Thus, according to the present disclosure embodiment, the misalignment can be appropriately corrected. This helps to improve the yield in the semiconductor device and leads to an increase in the capacity of memory cells that can be used effectively.

Other Embodiments of the Present Disclosure

While an embodiment of the present disclosure and the effects thereof have been described in detail with a semiconductor device as an example. The present disclosure includes, but is not limited to this example, and the following other embodiments.

The present disclosure can be used for NAND flash memory and 3D memories other than NAND flash memory. The present disclosure can also be used for logic devices.

While several embodiments of the present disclosure have been described, these embodiments are presented as examples and are not intended to limit the scope of the invention. These new embodiments may be implemented in various other embodiments, and various omissions, replacements, and modifications may be made without departing from the scope of the invention. These embodiments and variations are included in the scope and gist of the invention, as well as in the claimed invention and its equivalents.

What is claimed is:

1. A method for generating a pattern of a mask used in an exposure process in a manufacturing process of a semiconductor device, the method comprising:
storing layout information in a database;
acquiring the layout information from the database;
calculating a mask function from the layout information;

calculating a misalignment value by a convolution of the mask layout function and an integral kernel having a predetermined parameter;

correcting a pattern to generate a corrected data using the misalignment value;

outputting the corrected data in a Graphic Design System (GDS) format as a mask pattern used in a manufacturing process of the mask; and forming the mask by an exposure using the mask pattern.

2. The method according to the claim 1, further comprising:

calculating the mask function based on a difference of materials or densities in a plurality of regions included in the layout information.

3. The method according to the claim 1, further comprising:

calculating the predetermined parameter by fitting to a measured value.

4. The method according to the claim 1, wherein the integral kernel includes a first integral kernel defined as $ik/|k|^n$ is an imaginary number), and the method further comprises calculating the misalignment value by the convolution of the mask function and the first integral kernel.

5. The method according to the claim 4, wherein the integral kernel further comprises a Gaussian function defined as $\exp(-\sigma^2 k^2/2)$ on the Fourier space, and the method further comprises calculating the misalignment value by the convolution of the mask function and a second integral kernel including a linear combination of a product of the Gaussian function and the first integral kernel.

* * * * *